US008999519B2

(12) United States Patent
Nishimura

(10) Patent No.: US 8,999,519 B2
(45) Date of Patent: Apr. 7, 2015

(54) SOLDER JOINT

(75) Inventor: Tetsuro Nishimura, Osaka (JP)

(73) Assignee: Nihon Superior Sha Co., Ltd. (JP)

( * ) Notice: Subject to any disclaimer, the term of this patent is extended or adjusted under 35 U.S.C. 154(b) by 46 days.

(21) Appl. No.: 12/738,646

(22) PCT Filed: Oct. 20, 2008

(86) PCT No.: PCT/JP2008/068956
§ 371 (c)(1),
(2), (4) Date: Apr. 19, 2010

(87) PCT Pub. No.: WO2009/051255
PCT Pub. Date: Apr. 23, 2009

(65) Prior Publication Data
US 2010/0266870 A1 Oct. 21, 2010

(30) Foreign Application Priority Data

Oct. 19, 2007 (JP) ................. 2007-272810

(51) Int. Cl.
B32B 15/01 (2006.01)
C22C 13/00 (2006.01)
B23K 35/02 (2006.01)
B23K 35/26 (2006.01)
H05K 3/34 (2006.01)

(52) U.S. Cl.
CPC ............ *C22C 13/00* (2013.01); *B23K 35/0244* (2013.01); *B23K 35/262* (2013.01); *H05K 3/3457* (2013.01)

(58) Field of Classification Search
USPC .................. 428/646; 420/560, 561; 528/56.3; 228/262.9, 56.3
See application file for complete search history.

(56) References Cited

U.S. PATENT DOCUMENTS

| 4,643,875 | A  | * | 2/1987  | Mizuhara ................. 420/502 |
| 5,127,969 | A  | * | 7/1992  | Sekhar ..................... 148/23 |
| 6,179,935 | B1 | * | 1/2001  | Yamashita et al. ........... 148/400 |
| 6,180,055 | B1 |   | 1/2001  | Tetsuro |
| 6,296,722 | B1 |   | 10/2001 | Nishimura |
| 6,440,360 | B1 | * | 8/2002  | Sawamura et al. ........... 420/560 |

(Continued)

FOREIGN PATENT DOCUMENTS

EP 1911543 4/2008
JP 10-107420 4/1998

(Continued)

OTHER PUBLICATIONS

W.H. Müller, "Morphology changes in solder joints—experimental evidence and physical understanding," Microelectronics Reliability, vol. 44, Issue 12, Dec. 2004, pp. 1901-1914.*

(Continued)

Primary Examiner — Mark Ruthkosky
Assistant Examiner — Daniel J Schleis
(74) Attorney, Agent, or Firm — Thompson Hine LLP

(57) ABSTRACT

A solder joint manufactured of an alloy essentially composed of 0.01-7.6 wt % Cu, 0.001-6 wt % Ni, and the remaining of Sn. Each of Cu and Ni has a maximum concentration range. The lower limit of the range of Ni is 0.01 wt % and preferably 0.03 wt %. The upper limit of the range of Ni is 0.3 wt % and preferably 0.1 wt %. The lower limit of the range of Cu is 0.1 wt % and preferably 0.2 wt %. The upper limit of the range of Cu is 7 wt % and preferably 0.92 wt %. The invention includes the solder joint essentially having these compositions.

19 Claims, 19 Drawing Sheets

(56) References Cited

U.S. PATENT DOCUMENTS

| | | |
|---|---|---|
| 2002/0018844 A1 | 2/2002 | Kitajima et al. |
| 2003/0021718 A1 | 1/2003 | Munekata et al. |
| 2004/0062679 A1 | 4/2004 | Munekata et al. |
| 2006/0263234 A1* | 11/2006 | Seelig .................. 420/561 |
| 2007/0178007 A1 | 8/2007 | Thantrong et al. |

FOREIGN PATENT DOCUMENTS

| | | |
|---|---|---|
| JP | 2000-197988 | 7/2000 |
| JP | 2005-14076 | 1/2005 |
| JP | 2005-103645 | 4/2005 |
| JP | 2005-254298 | 9/2005 |
| JP | 2006-289434 | 10/2006 |
| JP | 2007-105750 | 4/2007 |
| JP | 2007-175776 | 7/2007 |
| JP | 2007-196289 | 8/2007 |
| JP | 2007-260779 | 10/2007 |
| JP | 2008-43978 | 2/2008 |
| WO | 99/48639 | 9/1999 |
| WO | 2007/010927 | 1/2007 |

OTHER PUBLICATIONS

Jeong, Sang Won, et. al, "Effect of Cooling Rate on Growth of the Intermetallic Compound and Fracture Mode of Near-Eutectic Sn—Ag—Cu/Cu Pad: Before and After Aging," Journal of Electronic Materials, vol. 33, No. 12, 2004, pp. 1530-1544.*

PCT, International Search Report, International Application No. PCT/JP2008/068956, 4 pages (completed Dec. 5, 2008; published Apr. 23, 2009).

PCT, Written Opinion, International Application No. PCT/JP2008/068956, 4 pages (completed Dec. 5, 2008).

PCT, International Preliminary Report on Patentability, International Application No. PCT/JP2008/068956; 7 pages (May 20, 2010).

* cited by examiner

Sn-Cu two-element phase diagram

Expanded area

Sn-Cu two-element phase diagram

Photograph illustrating a crystal lattice image of an intermatallic compound in Sn-0.7Cu-0.05Ni and an electron diffraction pattern (concentration of η-(Cu,Ni)$_6$Sn$_5$ Ni of hexagonal crystal is 9at%)

Fig. 4
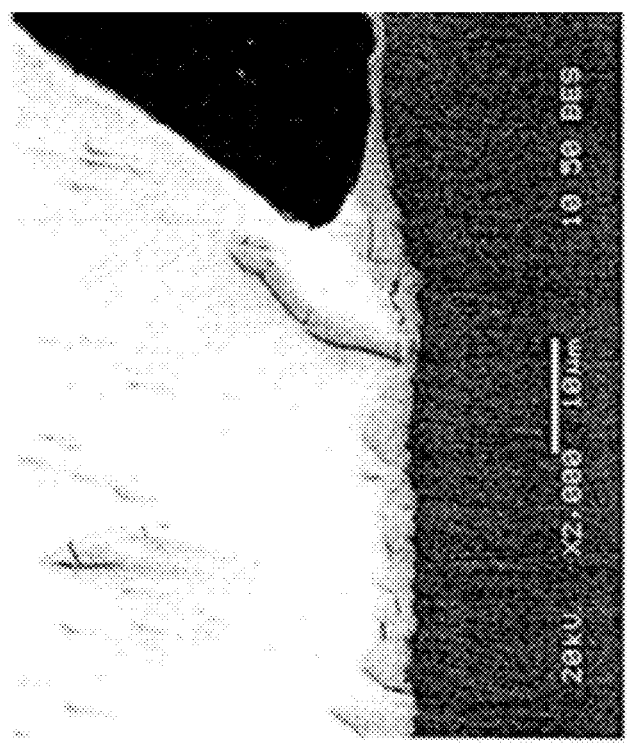
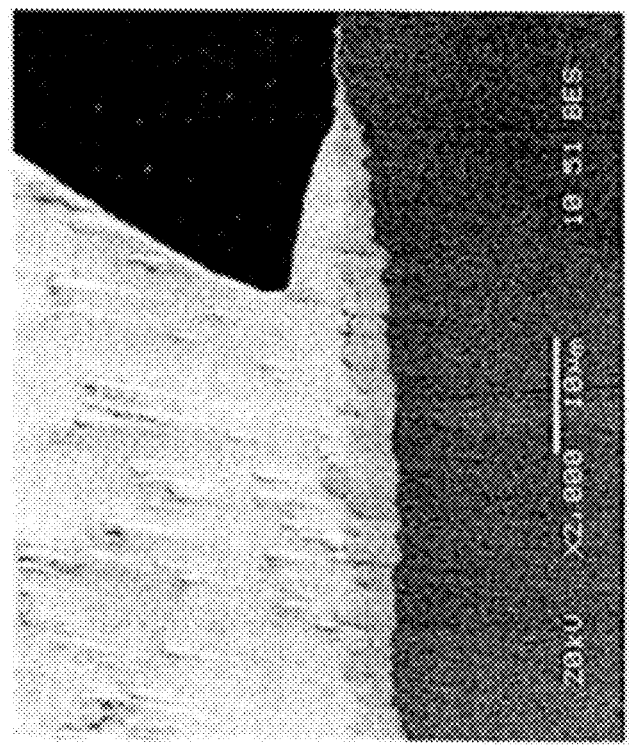

Fig. 5
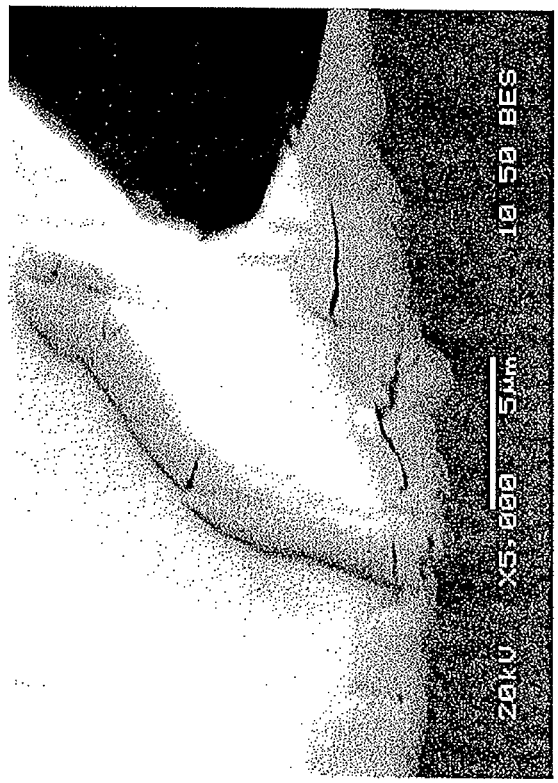
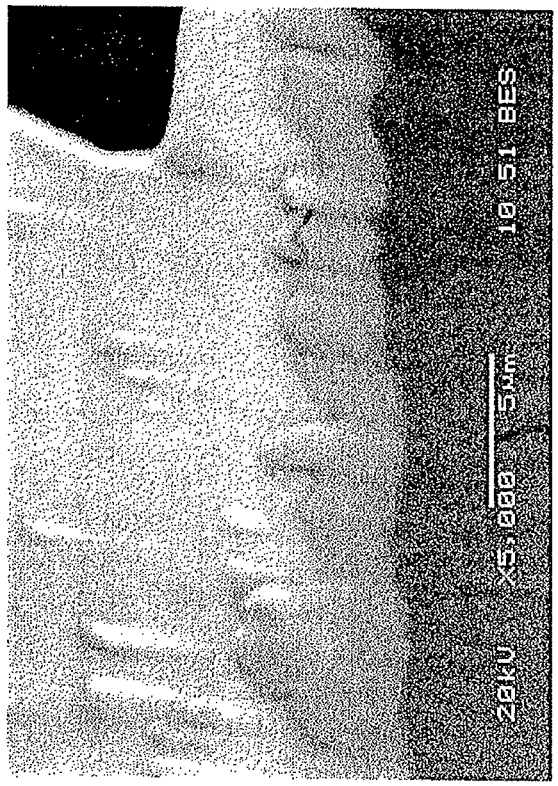

[Temperature profile in a reflow condition]

[A measured example of a crack created in IMC layer]

[SEM photographs of two types of BGA specimens illustrating a cross-section of IMC and interface of Sn-IMC]

[Graph indicating an amount of absorbed energy in pull test of a solder bonded specimen performed using BGA ball solder specimen]

Fig. 10
[Graph plotting the test results of the relation between compositions of alloys used in test and measurement values of the number of cracks and crack overall length per IMC layer unit length of specimens soldered through dipping]

[Relation between the number of cracks per IMC layer unit length and the amount of addition of Ni]

1. Measurement of values of Cu concentration 0.01(wt%)

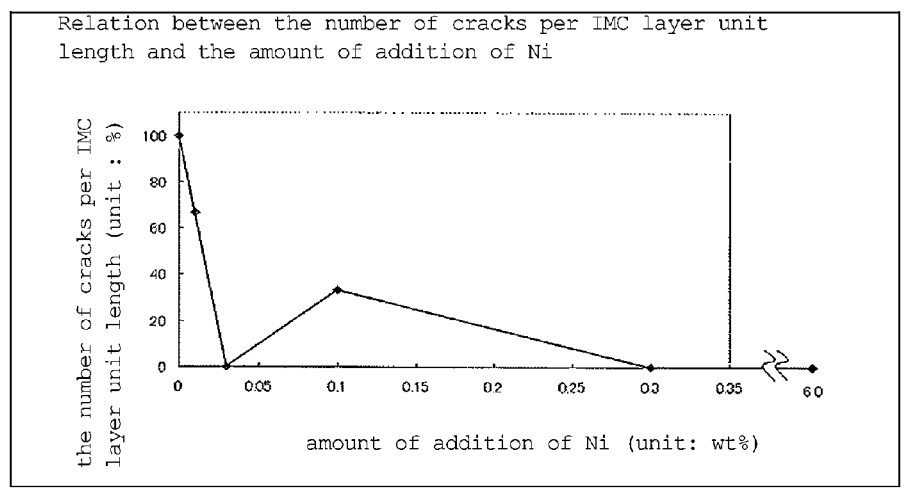

[Relation between crack overall length per IMC layer unit length and the amount of addition of Ni]

1. Measurement of values of Cu concentration 0.01(wt%)

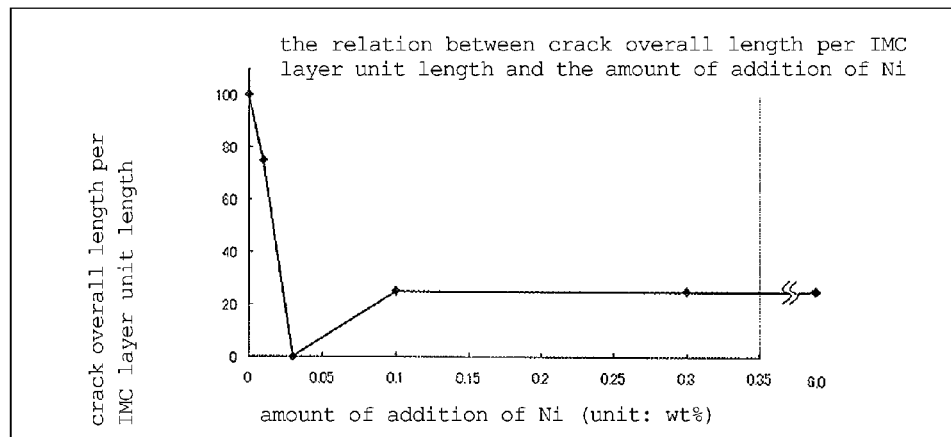

※ Each measurement value of the amount of addition of Ni is indicated by %.
   A measurement value is 100 when the amount of addition of Ni is 0.

Fig. 11
[Graph plotting the test results of the relation between compositions of alloys used in test and measurement values of the number of cracks and crack overall length per IMC layer unit length of specimens soldered through dipping]

[The relation between the number of cracks per IMC layer unit length and the amount of addition of Ni]

2. Measurement of values of Cu concentration 0.1(wt%)

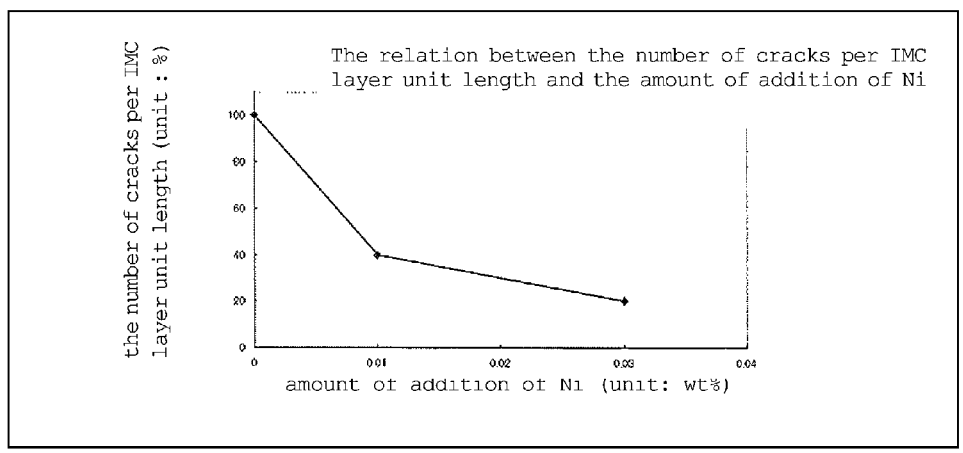

[Relation between overall crack length per IMC layer unit length and the amount of addition of Ni]

2.Measurement of values of Cu concentration 0.1(wt%)

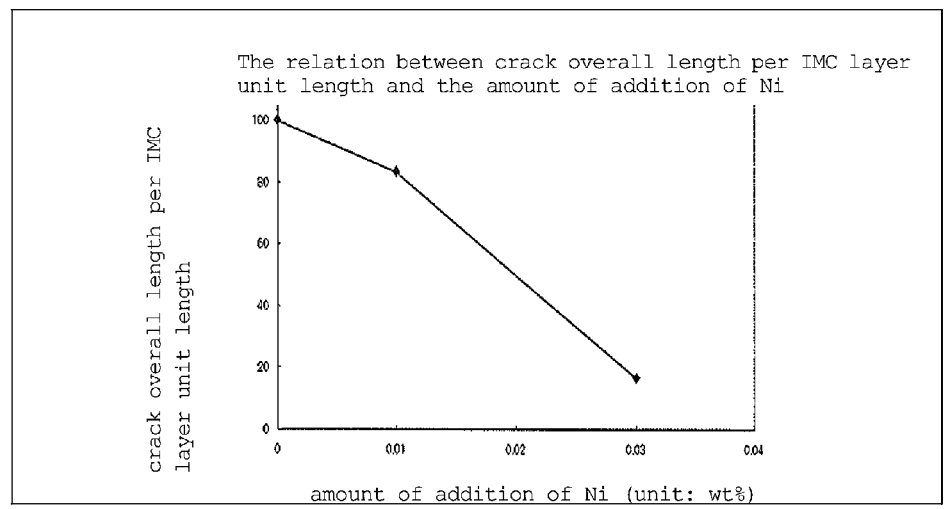

※ Each measurement value of the amount of addition of Ni is indicated by %.
A measurement value is 100 when the amount of addition of Ni is 0.

Fig. 12
[Graph plotting the test results of the relation between compositions of alloys used in test and measurement values of the number of cracks and crack overall length per IMC layer unit length of specimens soldered through dipping]

[Relation between the number of cracks and per IMC layer unit length and the amount of addition of Ni]

3. Measurement of values of Cu concentration 0.2(wt%)

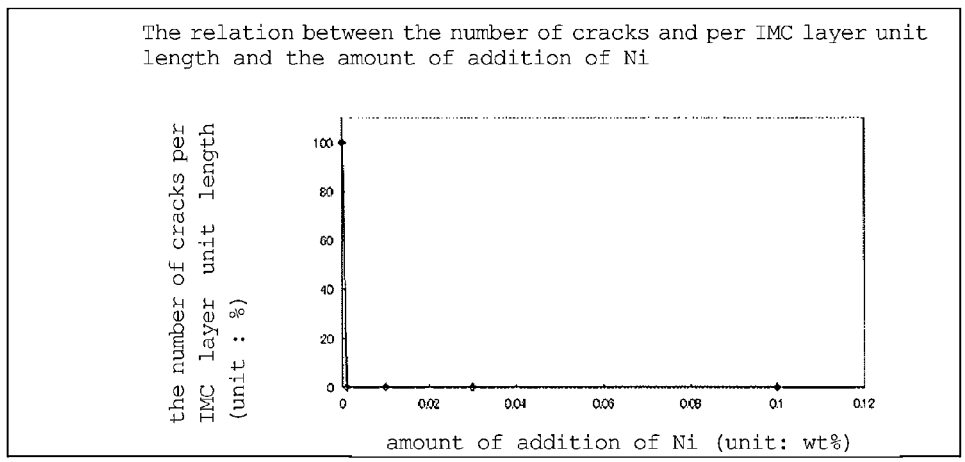

[Relation between overall crack length per IMC layer unit length and the amount of addition of Ni]

3. Measurement of values of Cu concentration 0.2(wt%)

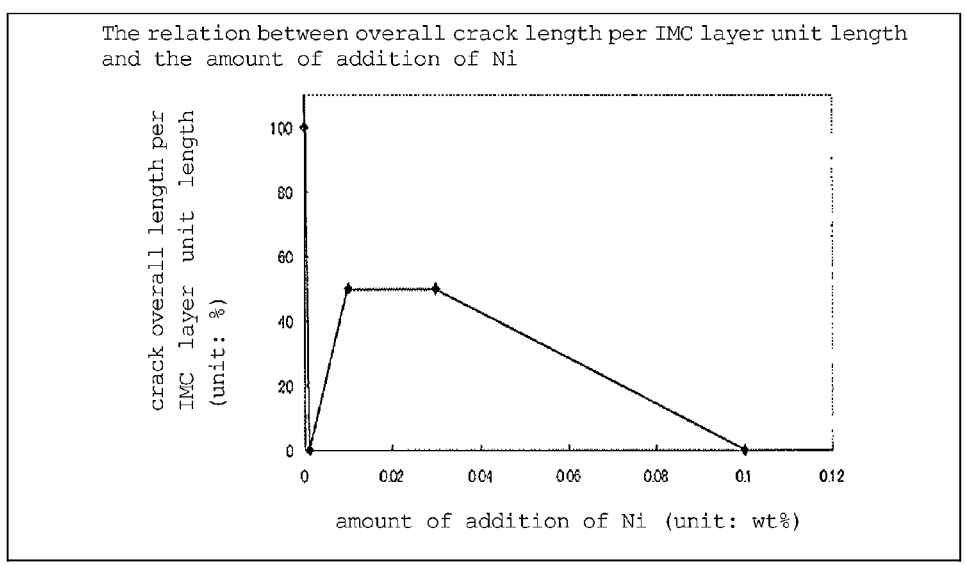

※ Each measurement value of the amount of addition of Ni is indicated by %.
  A measurement value is 100 when the amount of addition of Ni is 0.

Fig. 13
[Graph plotting the test results of the relation between compositions of alloys used in test and measurement values of the number of cracks and crack overall length per IMC layer unit length of specimens soldered through dipping]

[Relation between the number of cracks per IMC layer unit length and the amount of addition of Ni]

4. Measurement of values of Cu concentration 0.92(wt%)

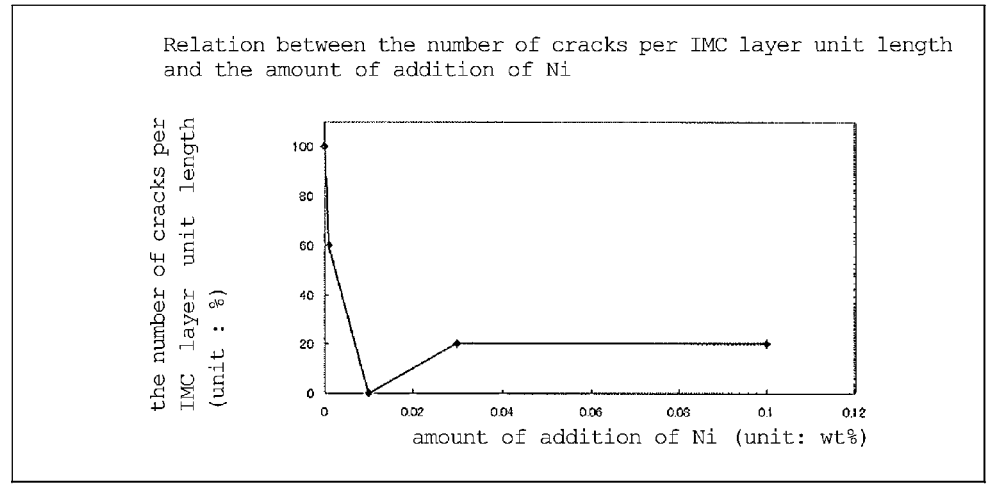

[Relation between overall crack length per IMC layer unit length and the amount of addition of Ni]

4. Measurement of values of Cu concentration 0.92(wt%)

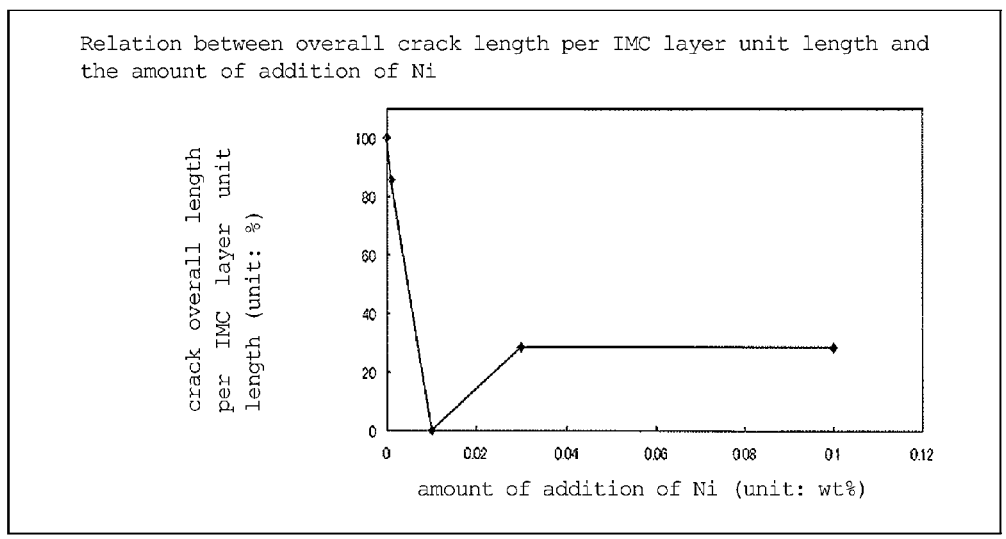

※ Each measurement value of the amount of addition of Ni is indicated by %.
A measurement value is 100 when the amount of addition of Ni is 0.

Fig. 14
[Graph plotting the test results of the relation between compositions of alloys used in test and measurement values of the number of cracks and crack overall length per IMC layer unit length of specimens soldered through dipping]

[Relation between the number of cracks per IMC layer unit length and the amount of addition of Ni]

5. Measurement of values of Cu concentration 3.0(wt%)

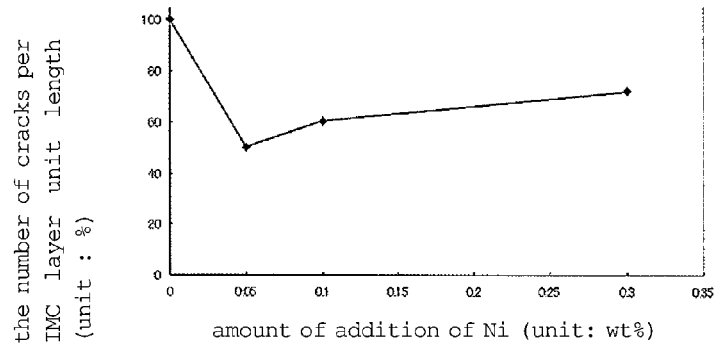

[Relation between overall crack length per IMC layer unit length and the amount of addition of Ni]

5. Measurement of values of Cu concentration 3.0(wt%)

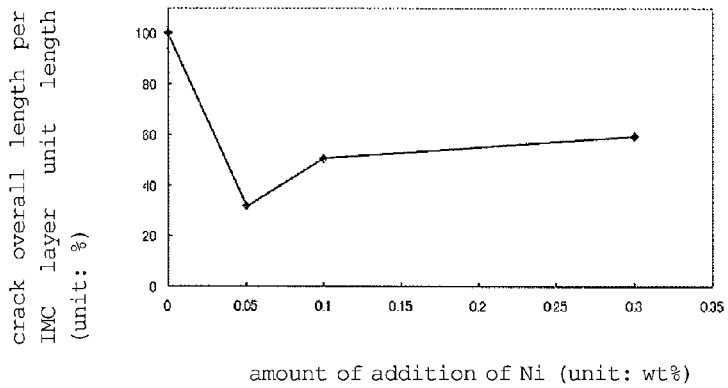

※ Each measurement value of the amount of addition of Ni is indicated by %.
  A measurement value is 100 when the amount of addition of Ni is 0.

Fig. 15
[Graph plotting the test results of the relation between compositions of alloys used in test and measurement values of the number of cracks and crack overall length per IMC layer unit length of specimens soldered through dipping]

[Relation between the number of cracks per IMC layer unit length and the amount of addition of Ni]

6.Measurement of values of Cu concentration 7.6(wt%)

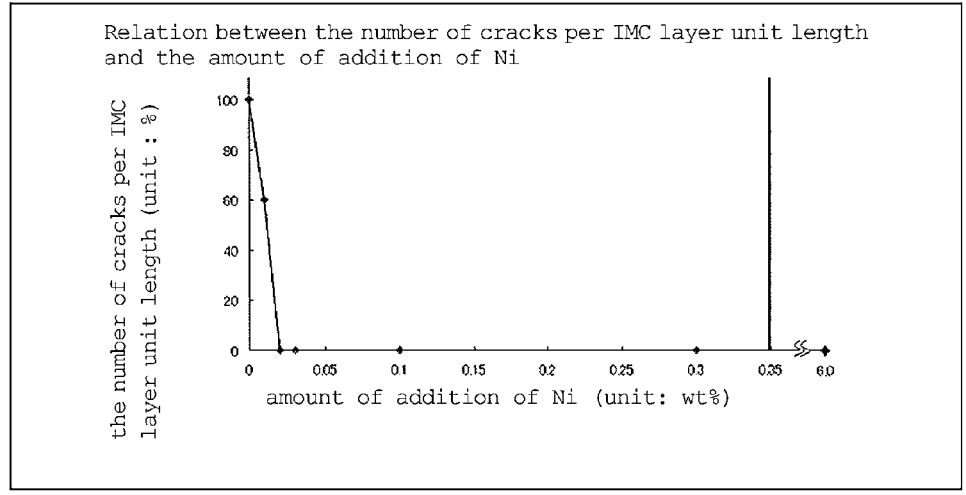

[Relation between overall crack length per IMC layer unit length and the amount of addition of Ni]

6.Measurement of values of Cu concentration 7.6(wt%)

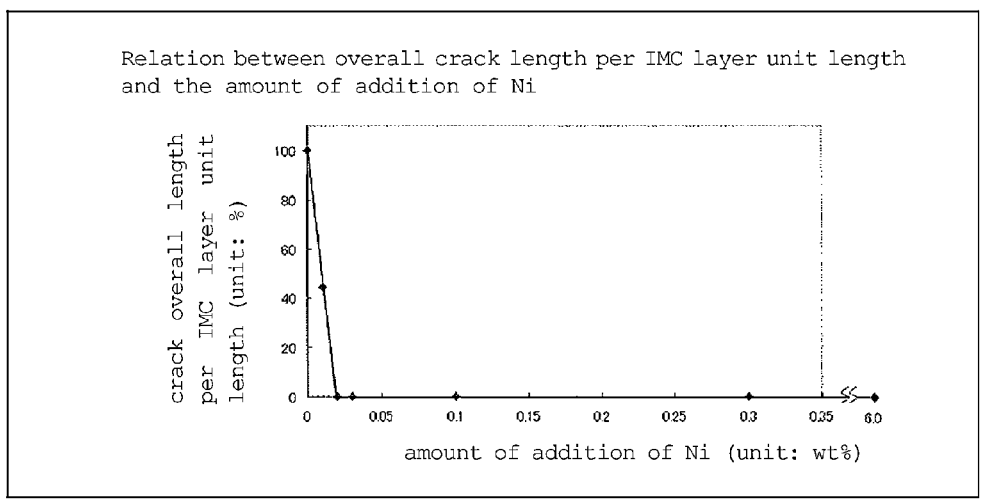

※ Each measurement value of the amount of addition of Ni is indicated by %.
   A measurement value is 100 when the amount of addition of Ni is 0.

Photographs illustrating cracks in IMC layer depending on the presence or absence of Ni addition in compositions of alloys used in test Photographs illustrating cracks in IMC layer depending on the presence or absence of Ni addition in compositions of alloys used in test Photographs illustrating cracks in IMC layer depending on the presence or absence of Ni addition in compositions of alloys used in test Photographs illustrating cracks in IMC layer depending on the presence or absence of Ni addition in compositions of alloys used in test Photograph illustrating cracks in IMC layer depending on the presence or absence of Ni addition in compositions of alloys used in test Photograph illustrating cracks in IMC layer depending on the presence or absence of Ni addition in compositions of alloys used in test ated metal

SOLDER JOINT

TECHNICAL FIELD

The present invention relates to a solder joint that is less susceptible to a break or a crack in a joint interface when a solder joint is formed.

BACKGROUND ART

Solder has been conventionally used to mount electronic components on a printed circuit board. Since the currently noticeable trend is to avoid using Pb for a solder alloy, solder technique is currently shifting to so-called Pb free soldering in which Pb is not used. Currently, the mainstream Pb free solder alloy includes two types of compositions, that is a tin-silver-copper system and a tin-copper system.

In view of availability of materials, costs of the materials, and reliability of products, the mainstream Pb free solder is the one made of Sn as a main element with an additive metal selected thereto. The inventor of this invention has developed so-called tin-copper solder based on Sn—Cu.
Patent Document 1: Japanese Open Gazette No. 10-107420
Patent Document 2: WO99/48639

DISCLOSURE OF THE INVENTION

Problems to be Solved by the Invention

Of the above related art, Patent Document 1 relates to a tin-copper solder based alloy containing Sn-0.7% Cu serving as a material of a solder joint, and Patent Document 2 relates to a tin-copper solder based alloy containing Sn—Cu—Ni developed by the inventor of this invention.

A variety of characteristics required of solder include wettabliity in a soldering operation, fluidity of molten solder, mechanical strength of solidified solder as a solder joint, and electrical characteristics. A solder alloy, even if satisfying currently required characteristics, is subject to a small fracture and a break called a crack in the joint interface of the solder joint with a printed circuit board when the joint is formed. The solder joint having a crack therein leads to serious problems. For example, the solder joint with cracks may become a cause of a drop in the joint strength, and a cause for heating and then fire due to large electrical resistance as a result a reduced joint area.

Knowing that such a crack leads to a serious defect to one of a solder bound component and a solder joint portion, the inventor repeated tests based on the assumption that a mechanism working at the solidification of a solder alloy is one factor in the development of the crack, and searched for a solder joint that is less susceptible to the generation of crack, and overcame the above problem by the inventive composition.

Means for Solving the Problems

To overcome the above-described problem, the present invention results in a solder joint made of a lead-free solder alloy composed of 0.01-7.6% by weight Cu, 0.001-6% by weight Ni, and the remaining part being Sn. In accordance with this composition, each of Cu and Ni has a maximum range, the generation of cracks is reduced within these ranges in comparison with another composition. In view of practicability, the composition for effectively reducing the generation of cracks is determined in stepwise range. More specifically, in a solder alloy used to manufacture the solder joint, the lower limit of Ni is 0.01% by weight and preferably 0.03% by weight. Also, the upper limit of Ni is 0.3% by weight and preferably 0.1% by weight.

The lower limit of Cu is 0.1% by weight and preferably 0.2% by weight. Also, the upper limit of Cu is preferably 7% by weight and more preferably 0.92% by weight.

In accordance with another means of the present invention, at least one metal selected from the group consisting of Co, Mn, Zn, and Pt replaces with Ni in the above composition. A metal not substantially interfering with an operation or function of Ni, Pd, Co, Mn, Zn, or Pt with respect to an alloy Sn—Cu of the present invention, for example, Ag, Sb, Bi, or the like may be permitted to be contained as an impurity. It is not necessarily meant that the impurity herein agrees with an impurity concentration defined by ISO standards. The impurity simply means a concentration equal to or above an additive amount that substantially interferes with the advantage expected in the present invention.

A process to form a solder joint generally refers to the process performed by a soldering iron, a reflow soldering process, a dip or flow soldering process. Since the amount of metal dissolving from a joint surface such as a printed circuit board is substantially limited in the case of the reflow soldering process, the solder composition itself can be the composition of the joint. On the other hand, since a joint surface is exposed to molten solder in the case of the flow soldering process, a leaching takes place and it is likely that a metal to be leached can be rich to some degree in composition in the solder alloy in use and the solder joint as a product. However, as long as the molten solder is maintained as an original composition range, transition in the compositions is slight and not greatly off the initial solder alloy composition, and falls within a margin of error. In the claimed invention, there is no large difference in composition between the solder joint manufactured using the solder alloy having the claimed composition and the solder alloy having the claimed composition. The manufacturing of the solder joint of the present invention is not limited to the above-described processes, and the present invention is applicable to all the solder joints obtained from the generally available manufacturing method of the solder joint.

In a temperature process to obtain an appropriate solder joint, the solder joint is preferably gradually cooled in a process immediately subsequent to the soldering operation to settled solidification. If the solder joint is rapidly cooled at a high cooling rate, the solder joint is more affected by a thermal distortion in the structure of a component to be joined than a distortion originated from the solder itself. If the thermal distortion exceeds a limit at any location, a crack is generated there. Normally, metals such as the solder joint, a metal foil on a printed circuit board, and a lead wire, cools rapidly, but the printed circuit board made of a resin cools slow because of the low heat conductivity thereof. Since the resin forming the printed board has a high expansion coefficient, and has a high glass-transition temperature (TG) to increase heat resistance, the resulting thermal distortion is considered to be high. To avoid the generation of cracks due to a difference between the heat resistance distortions of the metal and the resin, a gradual cooling operation is preferably performed in a manner such that the effect of the difference does not affect greatly the solder joint. The cooling rate is preferably within a range of 2-5° C./second although such method is different from the method of the reflow soldering process or the flow soldering process.

The operation of the present invention is described below with respect to a Sn—Cu—Ni alloy. FIG. 1 is a Sn—Cu two-element state chart. It is known that in $Cu_6Sn_5$ as an intermetallic compound of Sn and Cu, having about 39.1% by weight copper, a monoclinic crystal η'-Cu$_6$Sn$_5$ appears in a temperature range lower than a transformation temperature of 187° C. lower than the solidus temperature 227° C., and a hexagonal crystal η-Cu$_6$Sn$_5$ appears in a temperature range up to the solidus temperature 227° C. In such a state, the solid phase transformation takes place from hexagonal to monoclinic with temperature falling during solidification. FIG. 2 is an expanded view of a major portion of the state chart of FIG. 1. The crystalline structure of the hexagonal crystal is so-called closed pack and the volume of the crystal is the smallest in a compact form. If the solid phase is transformed from hexagonal to monoclinic in this state, a change takes place in volume. When molten solder solidifies, the phase transformation is unavoidable in an intermetallic compound Cu$_6$Sn$_5$ deposited through falling temperature. There is a possibility that a crack is caused in the solidified solder joint in response to the above-described development when a Sn-based alloy is used. Even if no crack is visibly noticed on the joint portion, a distortional stress caused during the solid phase transformation is preserved at the joint portion. The release of such a distortional stress may be triggered by an external stress such as a light impact, and then a crack may be created.

On the other hand, it is known that if Ni is added to Sn—Cu compound, Ni is partially substituted for Cu of Cu$_6$Sn$_5$ phase, forming (Cu,Ni)$_6$Sn$_5$. Tests show that if the intermetallic compound of (Cu,Ni)$_6$Sn$_5$ has about 9% Ni, the crystalline structure of the intermetallic compound is hexagonal, and that the presence of the η-(Cu,Ni)$_6$Sn$_5$ of the hexagonal crystalline structure that develops above the transformation temperature is confirmed even at room temperature. This is because the substitution of Ni for part of Cu of Cu$_6$Sn$_5$ contributes to the stabilization of the crystalline structure as the hexagonal crystal. FIG. 3 illustrates the crystalline structure of the intermetallic compound with Ni present in the alloy. A specimen to be observed is made by uniformly melting a Sn-0.7 Cu-0.05 Ni alloy at about 300° C. and then solidifying the alloy. A structure to be observed is a crystalline structure of a (Cu,Ni)$_6$Sn$_5$ intermetallic compound. Element analysis is performed on the crystalline structure based on an electron diffraction pattern and the mean of any five locations. The apparatus used in the analysis is the field emission transmission electron microscope (FEG-TEM manufactured by Philips), and measurements are made at an acceleration voltage of 200 keV. The measurement methods are based on high-magnification crystal lattice observation (magnification: 640,000 times), electron diffraction pattern of 640 mm camera length, and energy dispersive spectrometry (EDS) by nano probe. As illustrated in FIG. 3, if Ni is present, the (Cu,Ni)$_6$Sn$_5$ crystalline structure is definitely hexagonal, and the mean concentration of Ni in the crystal was 9%. Table 1 lists elementary analysis results of the intermetallic compound at the selected five locations.

TABLE 1

Element Analysis Results of Intermetallic Compound of Specimen 2 (Hexagonal Crystal η-Cu$_6$Sn$_5$)

| at % | 1 | 2 | 3 | 4 | 5 | Av. | SD |
|---|---|---|---|---|---|---|---|
| Ni | 8.30 | 8.96 | 9.05 | 8.86 | 6.29 | 8.79 | 1.06 |
| Cu | 43.90 | 52.31 | 42.27 | 46.05 | 45.61 | 46.13 | 3.42 |
| Sn | 47.79 | 38.72 | 48.54 | 45.09 | 48.02 | 45.03 | 3.67 |
| Ni/Cu | 0.19 | 0.17 | 0.21 | 0.19 | 0.14 | 0.19 | 0.03 |
| (Cu,Ni)/Sn | 1.09 | 1.58 | 1.06 | 1.22 | 1.08 | 1.22 | 20 |

With these results noted, the inventor has verified that a proper amount of Ni to Sn—Cu causes the crystalline structure to be stably hexagonal even the (Cu,Ni)$_6$Sn$_5$ phase as the intermetallic compound falls in temperature in the solidification process, and that the solid phase transformation of Cu$_6$Sn$_5$ from hexagonal to monoclinic with no Ni added is restrained or avoided. In this way, the generation of cracks during the solid phase transformation is controlled and the preservation of the stress in the joint portion is avoided.

As for the amount of additive elements in the claims, a maximum value of Cu at which the solid phase transformation takes place is about 39.1% by weight in a state diagram, and at 7.6% by weight or above, a so-called peritectic reaction takes place in which the compound is shifted from a liquid phase to a Cu$_6$Sn$_5$ phase via a Cu$_3$Sn phase. In view of the application of the solder alloy, a concentration of 7.6% by weight Cu at which the solder at the Cu$_6$Sn$_5$ phase directly solidifies from the liquid phase without transitioning through the peritectic reaction is set to be the upper limit of Cu. The lower limit is determined to be 0.01% by weight based on the phase chart of FIG. 1, because the knowledge of the inventor is theoretically applied to the lower limit of a range of the transformation temperature with the solidus temperature also taken into consideration.

Furthermore, the inventor determines the upper limit of Cu at 7% by weight. This is because the melting point is one of the important factors in the soldering operation, and high-temperature solder is typically heated to about 400° C. The upper limit of Cu corresponds to a concentration of Cu at which Cu$_6$Sn$_5$ is caused to deposit in a Sn—Cu system. Furthermore, the inventor determines the upper limit of Cu at 0.92% by weight, and in this setting, an eutectic point in a Sn—Cu—Ni three elements state diagram that has recently become known is taken into consideration.

The inventor determines the lower limit of Cu at 0.1% by weight, and further at 0.2% by weight. This range is determined taking into consideration the practical advantage of adding Cu in view of the joint strength of the lead free solder alloy of a Sn—Cu system.

The additive amount of Ni is determined to be a maximum of the upper limit of 6% by weight taking into consideration that a substitution ratio between Cu and Ni is about 5:1, and that the maximum limit of Cu at which the solid phase transformation takes place in the Sn—Cu system is about 39.1% by weight as described above. Also, a minimum of the lower limit Ni is determined to be 0.001% by weight, taking into consideration the lower limit of Cu because the results show that the advantage of maintaining the hexagonal crystal with the Ni concentration of about 9 at % is achieved. The upper limit of Ni is determined to be 0.3% by weight or 0.1% by weight. This condition is determined in response to the step-wise upper limit of Cu taking into consideration the effective concentration of Ni of 9 at %. On the other hand, the lower limit of Ni is 0.01% by weight or 0.03% by weight in response to the stepwise lower limits of Cu.

In accordance with the present invention, Pd, Co, Mn, Zn, and Pt are selectively adopted as a replaceable metal with Ni in the above-described composition. This is because these metals form an intermetallic compound having a structure in which like Ni, these metals partially replace with Cu of the Cu$_6$Sn$_5$ intermetallic compound. Furthermore, Fe is also a metal that partially replaces with Cu of the Cu$_6$Sn$_5$ intermetallic compound in a similar manner. Although it is theoretically possible that Fe is placed in the same way as Pd, Co, Mn, Zn, and Pt, control of reaction of Fe responsive to the additive amount thereof is slightly difficult. From the standpoint of industrial applicability, Fe is outside the scope of the present invention.

It is a main object of the present invention to adopt an additive metal to be partially replaced with Cu in the Cu$_6$Sn$_5$ intermetallic compound. The inclusion of a metal as an impurity, such as Ag, Sb, or Bi, excluding the metal selected according to claim 10, is not rejected.

Advantages of Invention

In accordance with the present invention, the solder joint having the compositions described above is obtained. In the Sn—Cu alloy and the Sn—Cu alloy containing Ag, Sb, Bi etc. at an impurity level, the solid phase transformation is restrained or avoided at the solidification of the $Cu_6Sn_5$ intermetallic compound, and a volume change due to the solid phase transformation is not caused. Accordingly, this arrangement avoids not only a crack and break during solidification, but also controls the preservation of a stress in the joint portion that remains free from any crack at the time of solidification. Furthermore, this arrangement precludes a sudden creation of a crack with aging and a crack caused by a distortion resulting from a carelessly applied impact. A highly reliable solder joint is thus provided.

The lead-free solder alloy of the present invention may be supplied to the market in any contemplated forms, including bar solder, ball solder, foil solder, and wire solder. Also, as previously described, the present invention is applicable to any solder joints obtained through any available soldering method.

BRIEF DESCRIPTION OF THE DRAWINGS

FIG. 4 is a closeup picture of a cross-section of a cut sample of a joint made of each of Sn—Cu solder and Sn—Cu solder with Ni added thereto.

FIG. 5 is a closeup picture illustrating an expanded state of the picture of FIG. 4.

FIG. 10 is a graph plotting test results in accordance with a fourth embodiment of the present invention.

FIG. 11 is a graph plotting test results in accordance with the fourth embodiment of the present invention.

FIG. 12 is a graph plotting test results in accordance with the fourth embodiment of the present invention.

FIG. 13 is a graph plotting test results in accordance with the fourth embodiment of the present invention.

FIG. 14 is a graph plotting test results in accordance with the fourth embodiment of the present invention.

FIG. 15 is a graph plotting test results in accordance with the fourth embodiment of the present invention.

EMBODIMENT 1

The inventor manufactures ball solder based on two types of solder alloys, of Sn-0.7 Cu (all value hereinafter being % by weight) widely known as tin-copper based lead-free solder, and a solder alloy obtained by adding 0.05% by weight Ni to the Sn-0.7 Cu alloy, and obtains a solder joint by performing a reflow process in an ordinary method. FIG. 4 illustrates a cross-section of a cut sample of a junction section (joint section) of each solder observed by an electron microscope on 10 micrometer scale. In the photographs here, a lower layer represents Cu foil present on a printed circuit board, and an upper layer is a solder layer. As illustrated in the photographs, no crack at all is noticed in the junction section in the left photograph illustrating the solder joint with Ni added. In the sample bound by the Sn-0.7 Cu illustrated in the right photograph, cracks are noticed not only in the interface with the Cu foil but also the intermetallic compound apart from the junction portion. The cracks are not visible from the surface of the junction section, but the present of such cracks in the junction section reduces the junction strength.

Further, the inventor examined the cut sample of FIG. 4 on 5 micrometer scale for higher accuracy observation, thereby obtaining results illustrated in FIG. 5. In the observation at a high magnification, pronounced cracks are observed only in the Sn—Cu solder junction section, and even a small crack is not observed in the solder section with Ni added.

EMBODIMENT 2

Figure 1:
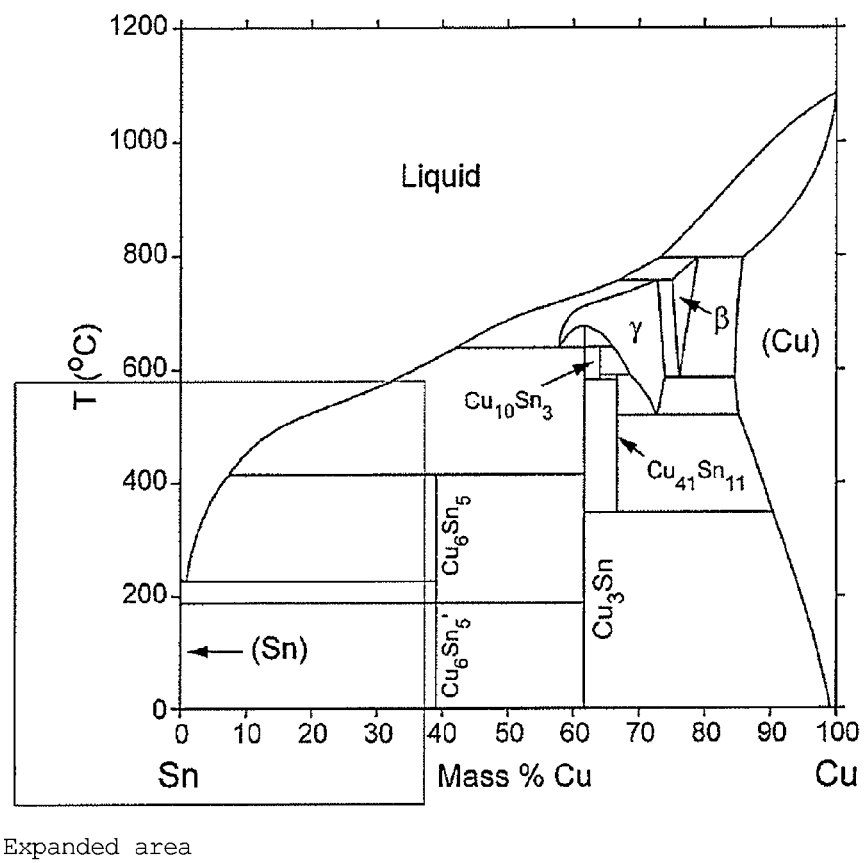
FIG. 1 is an Sn—Cu two-element phase diagram.
Figure 2:
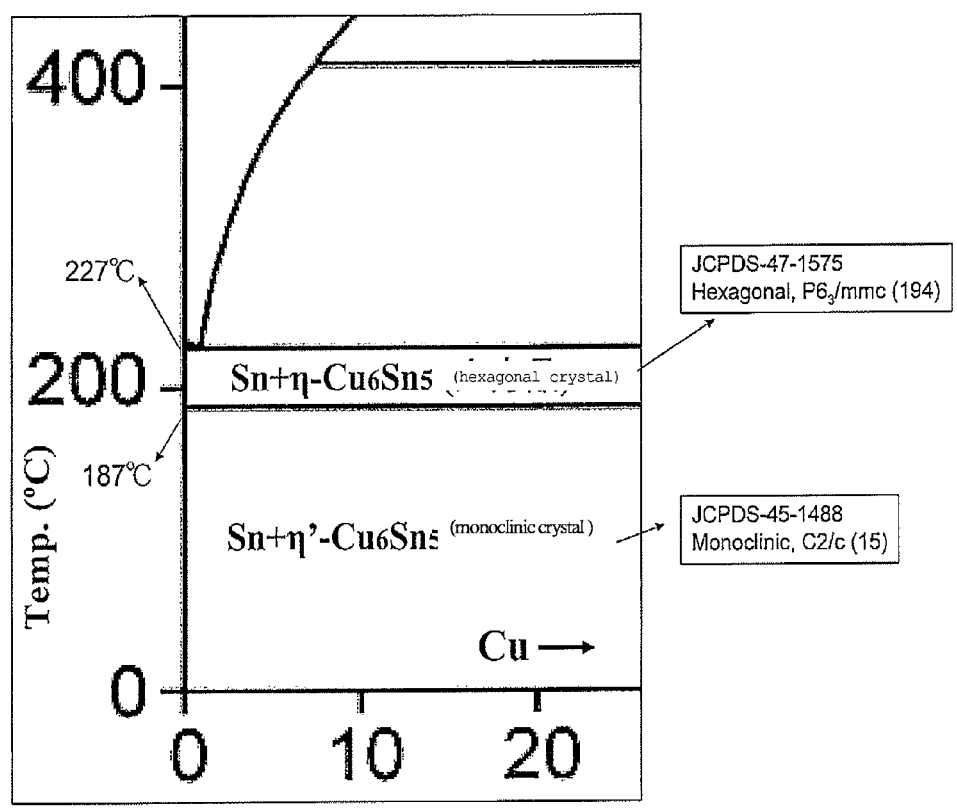
FIG. 2 is an expanded view of the two-element phase diagram of FIG. 1.
Figure 3:
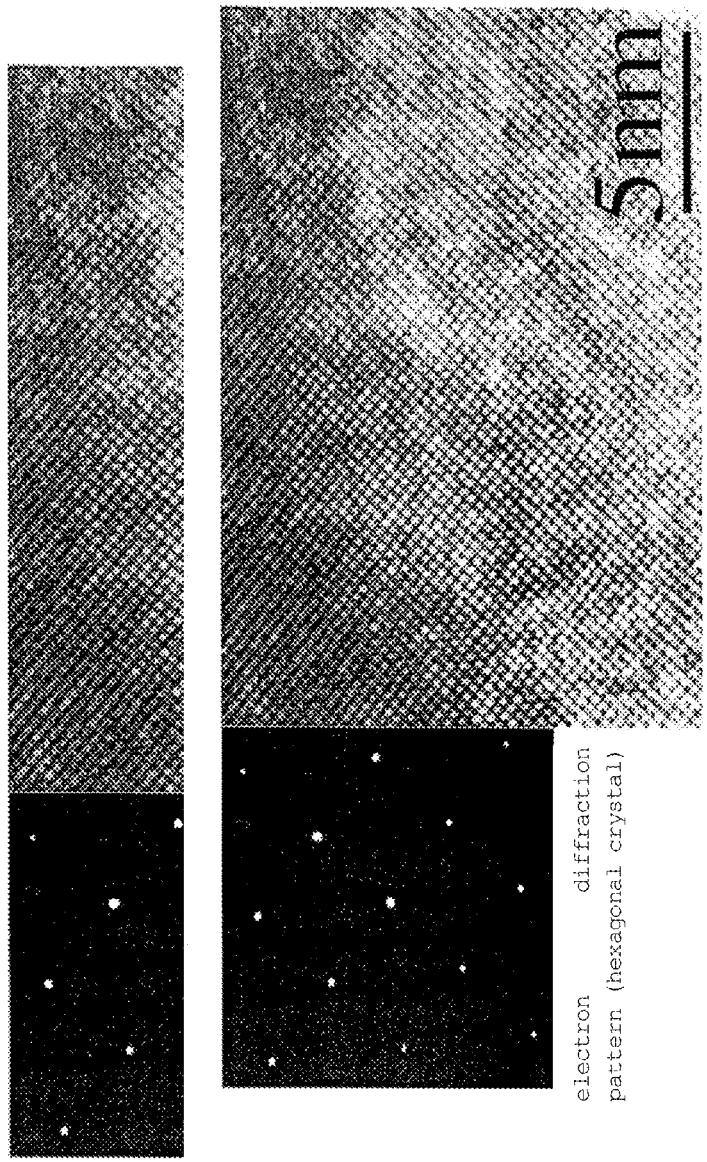
FIG. 3 is a photograph illustrating a crystalline structure of a $(Cu,Ni)_6Sn_5$ intermetallic compound.
Figure 6:
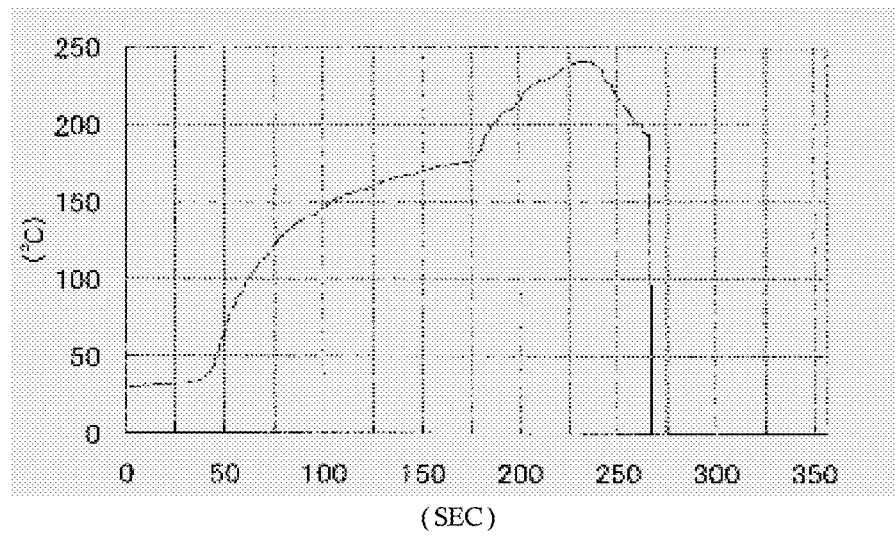
FIG. 6 is a graph plotting a temperature profile in a reflow condition in accordance with a second embodiment of the present invention.
Figure 7:
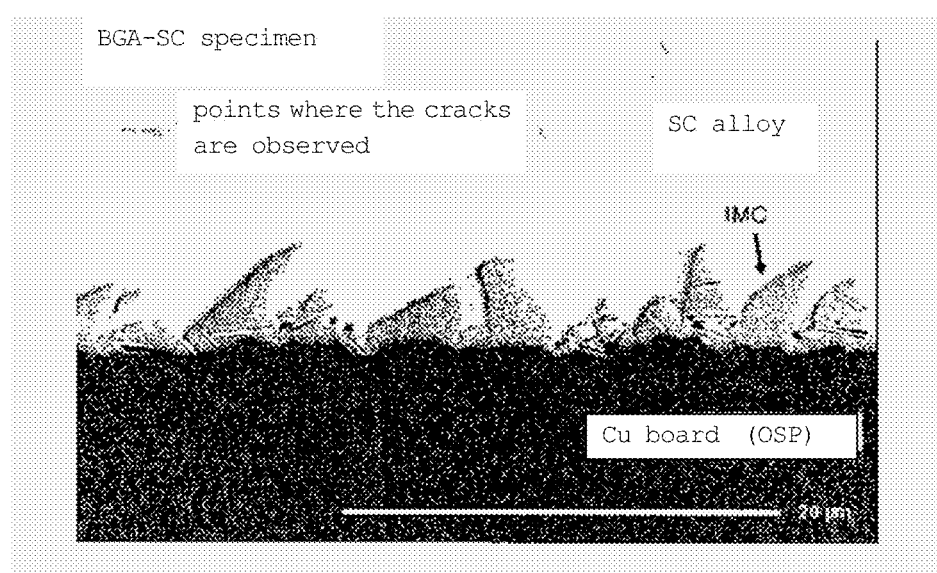
FIG. 7 is a photograph illustrating of a measured example of a crack created in an intermetallic compound in accordance with the second embodiment of the present invention.
Figure 8:
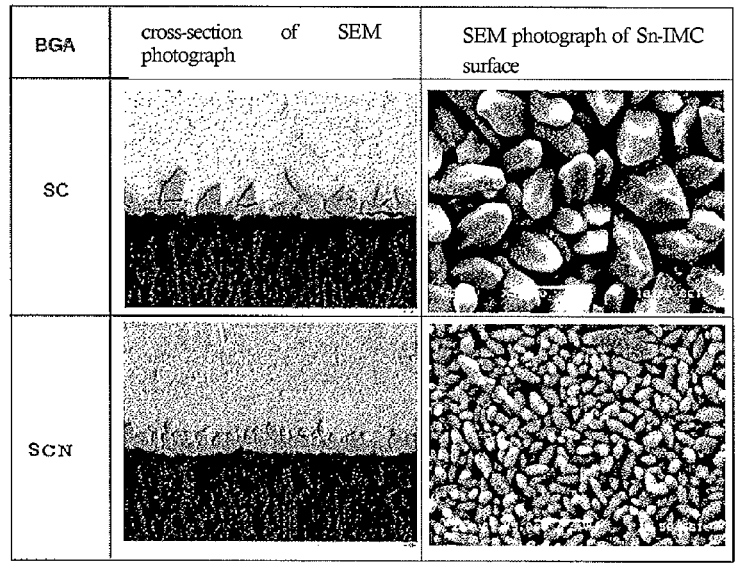
FIG. 8 is an SEM photograph illustrating a cross-section of the intermetallic compound and an interface with Sn in accordance with the second embodiment of the present invention.

Next, tests are made to verify in detail the advantages in ball solder. The specimens used here are identical to those of the embodiment 1. The ball solder is manufactured as a ball having a diameter of about 500 µm using a known ball solder manufacturing method. The two types of ball solder samples are placed on one OSP board, and the reflow process is performed twice in accordance with a temperature profile illustrated in FIG. 6. Solder junction specimens (solder joint specimens) are thus obtained. A gradual cooling operation, though not shown in FIG. 6, is performed at a cooling rate of 2-5° C./second subsequent to the end of the soldering process. In succession, the number and length of cracks created in the emerging intermetallic compound are measured. More specifically, the junction strengths of the solder alloys are compared by comparing the numbers and lengths of cracks created in the solder junction section (joint section) and the solder junction interface. In the measurement method, samples are embedded in a silicon resin to form a specimen for cross-section observation of the intermetallic compound. The cross-section is observed using the SEM, and element analysis is performed using the EDS. Scanning electron microscope (JSM 6460LA) manufactured by Japan Electron Optics Laboratory Co., Ltd. is used as a test instrument. Measurements are made at 20 kV acceleration voltage in a backscattering pattern mode. The measurement of cracks in the intermetallic compound and the measurement of the thickness of the intermetallic compound are performed using image analysis software (trade name AnalysisStation) manufactured by Japan Electron Optics Laboratory Co., Ltd. as illustrated in FIG. 7. As illustrated, SC solder refers to Sn—Cu solder, and IMC refers to an intermetallic compound created through solidification. White lines drawn in the growing intermetallic compound represent the location of the occurrence of and the length of each crack. Furthermore, illustrated in FIG. 8 are cross-sectional SEM photographs of two types of specimens and surface SEM photographs of the intermetallic compounds, wherein it is verified that the specimen with Ni added thereto contains finer and uniform intermetallic compound than the Sn—Cu specimen. The intermetallic compound in the Sn—Cu is $Cu_6Sn_5$, but the intermetallic compound in the sample with Ni added is $(Cu, Ni)_6Sn_5$ with Ni replaced with Cu and individual crystals become finer

TABLES 2

[Number of cracks and overall crack length per IMC layer of solder bound specimen using BGA ball solder]

| Specimen No. | Number of cracks (Unit: crack) | Crack length (Unit: μm) | Number of cracks per IMC layer unit length | Overall crack length per IMC layer unit length |
|---|---|---|---|---|
| 1. Number of cracks and overall crack length per IMC layer unit length | | | | |
| SC | 72.33 | 97.86 | 0.31 | 0.42 |
| SCN | 40.67 | 42.27 | 0.16 | 0.16 |
| 2. Measurement values of [SN100C] with measurement value of [SC] being [100] | | | | |
| SC | 100.0 | 100.0 | 100.0 | 100.0 |
| SCN | 56.2 | 43.2 | 51.6 | 38.1 |

[Composition of alloy]
SC = Sn—0.7Cu (wt %)
SCN = Sn—0.7Cu—0.05Ni (wt %)

Table 2 lists the results of the embodiment 2, wherein the upper table lists the actual number and overall length of cracks in the two types of samples, and the lower table lists the results with the Ni added specimens in percentage with the results of Sn—Cu specimens with no Ni added thereto being 100. As listed, it is verified that the generation of and the length of cracks in the specimens with 0.005% by weight Ni added are controlled to about half the results of the Sn-0.7 Cu specimens. The basis of these values is described below.

The number of cracks per unit length of the intermetallic compound=the number of cracks measured/the length of the intermetallic compound The overall length of cracks per unit length of the intermetallic compound=overall length of cracks measured/the length of the intermetallic compound

EMBODIMENT 3

Figure 9:
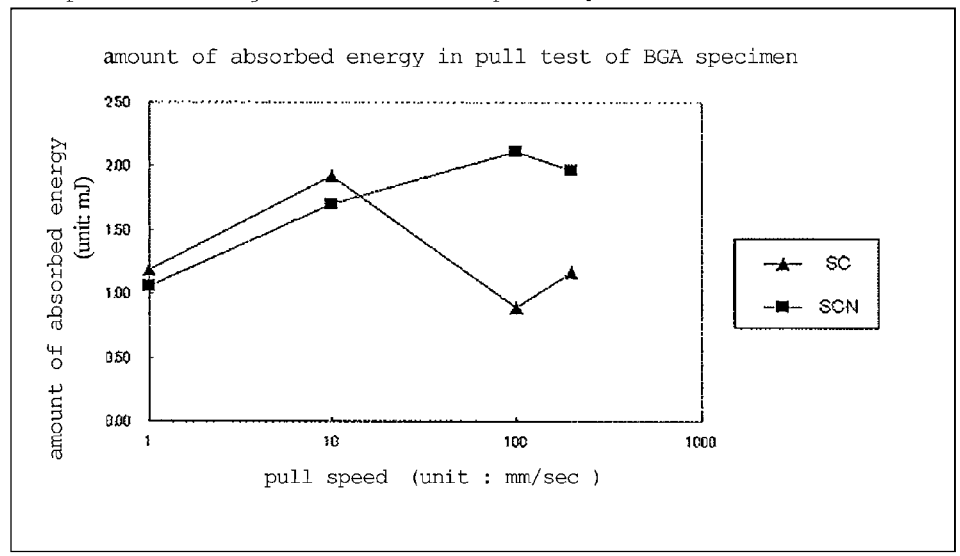
FIG. 9 is a graph plotting results of an impact test in accordance with a third embodiment of the present invention.
Figure 16:
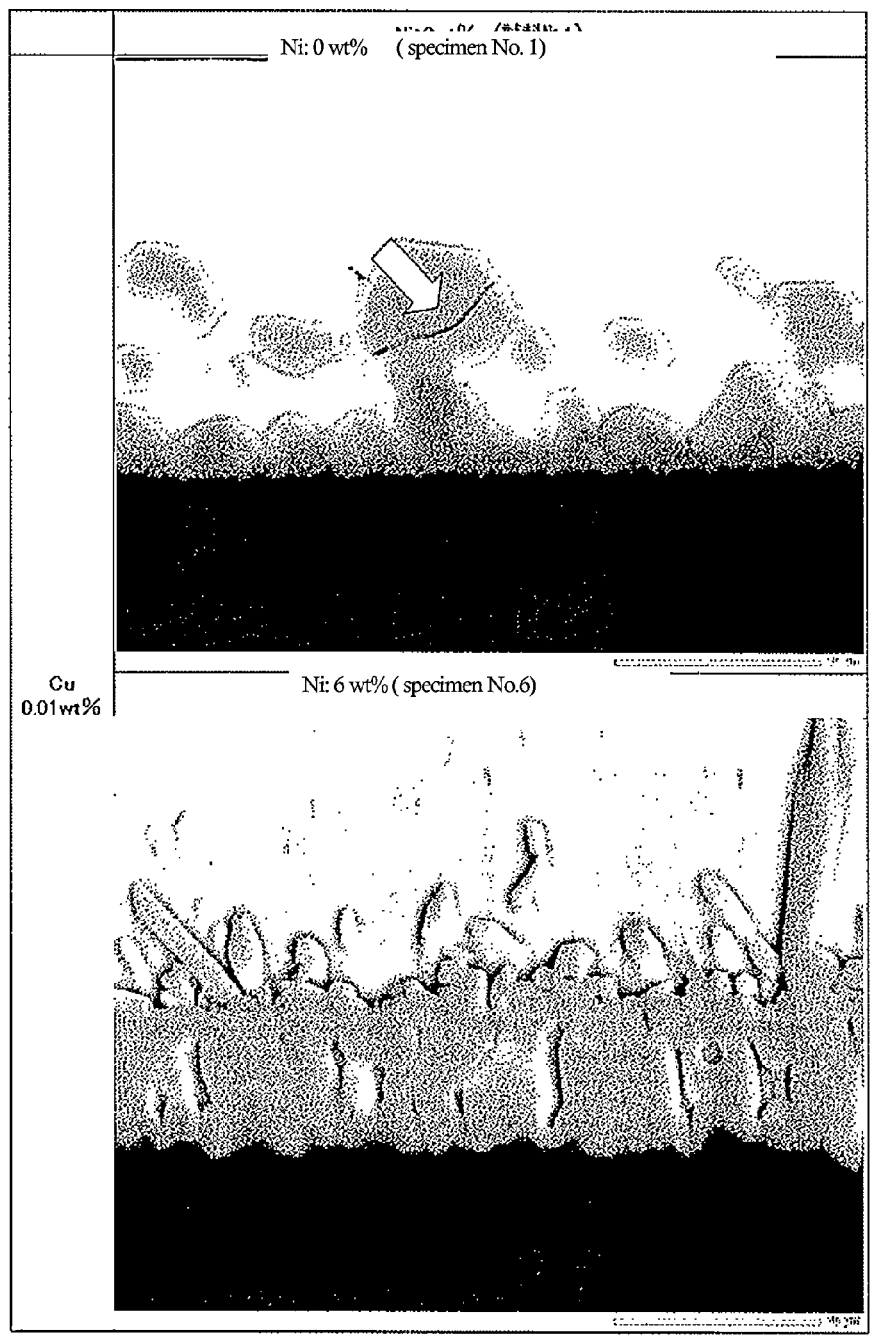
FIG. 16 is a photograph illustrating a cross-section of an intermetallic compound in accordance with a fourth embodiment of the present invention.
Figure 17:
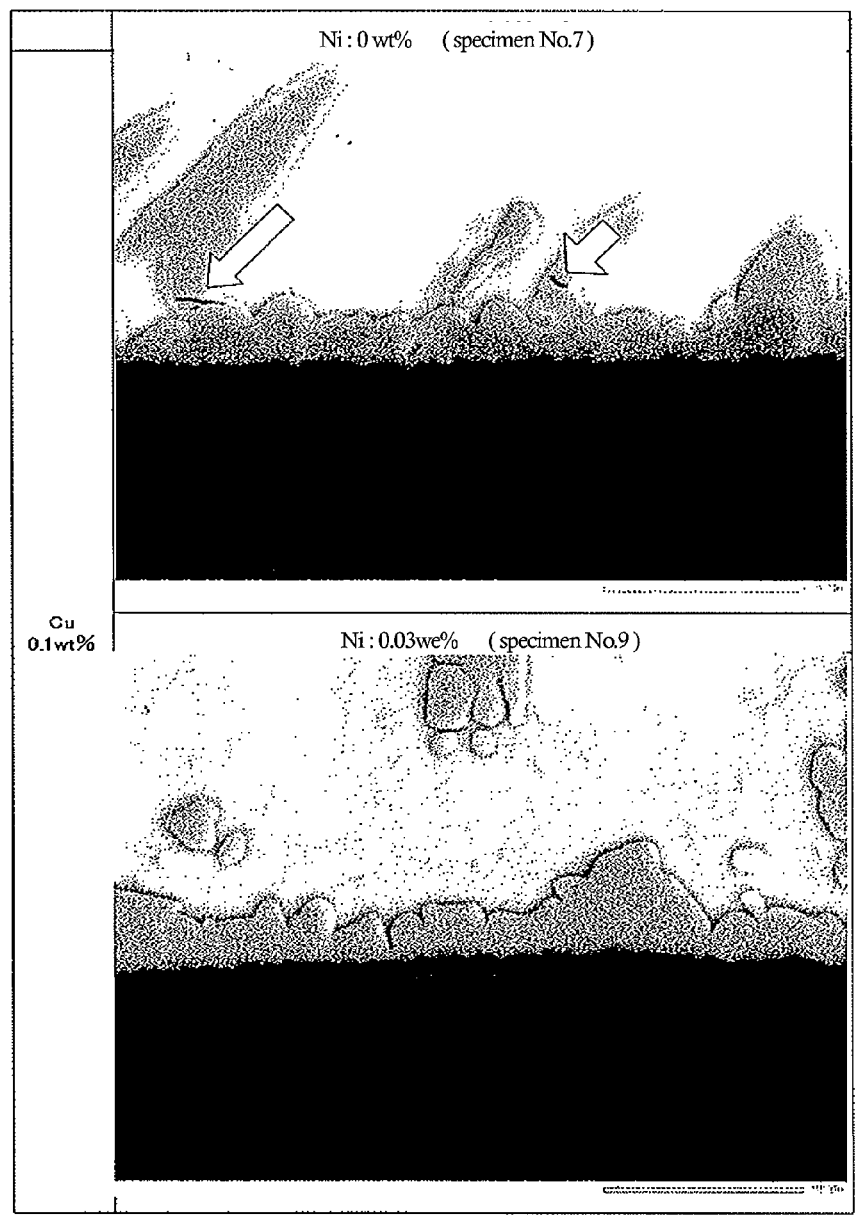
FIG. 17 is a photograph illustrating a cross-section of the intermetallic compound in accordance with the fourth embodiment of the present invention.
Figure 18:
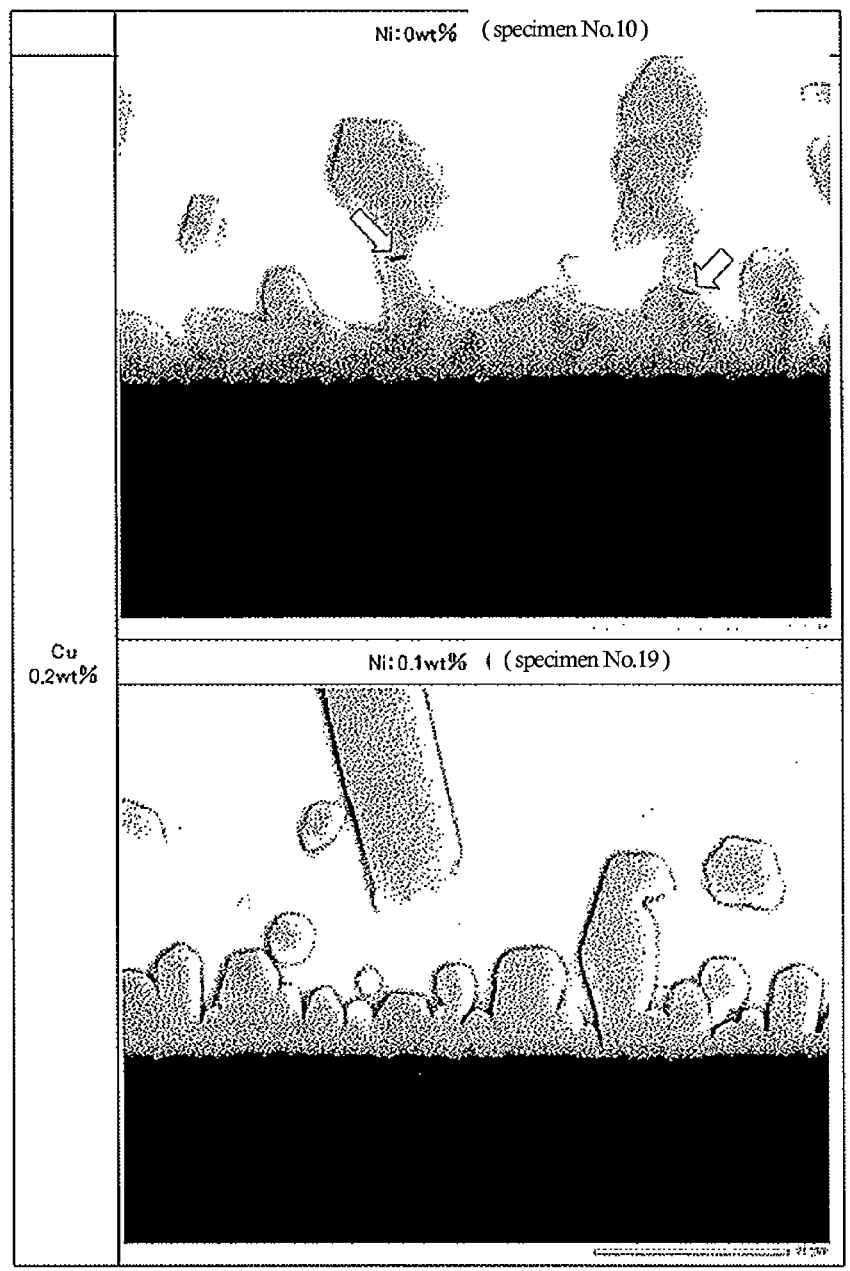
FIG. 18 is a photograph illustrating a cross-section of the intermetallic compound in accordance with the fourth embodiment of the present invention.
Figure 19:
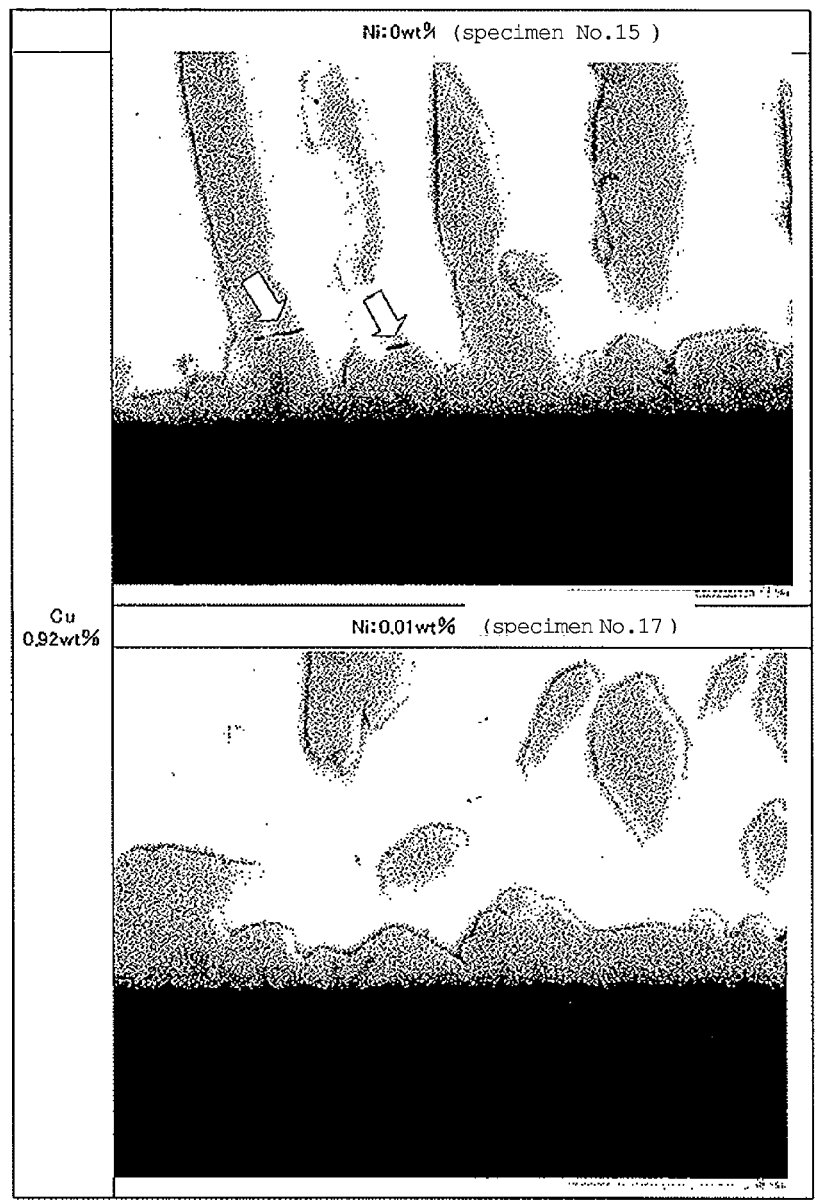
FIG. 19 is a photograph illustrating a cross-section of the intermetallic compound in accordance with the fourth embodiment of the present invention.
Figure 20:
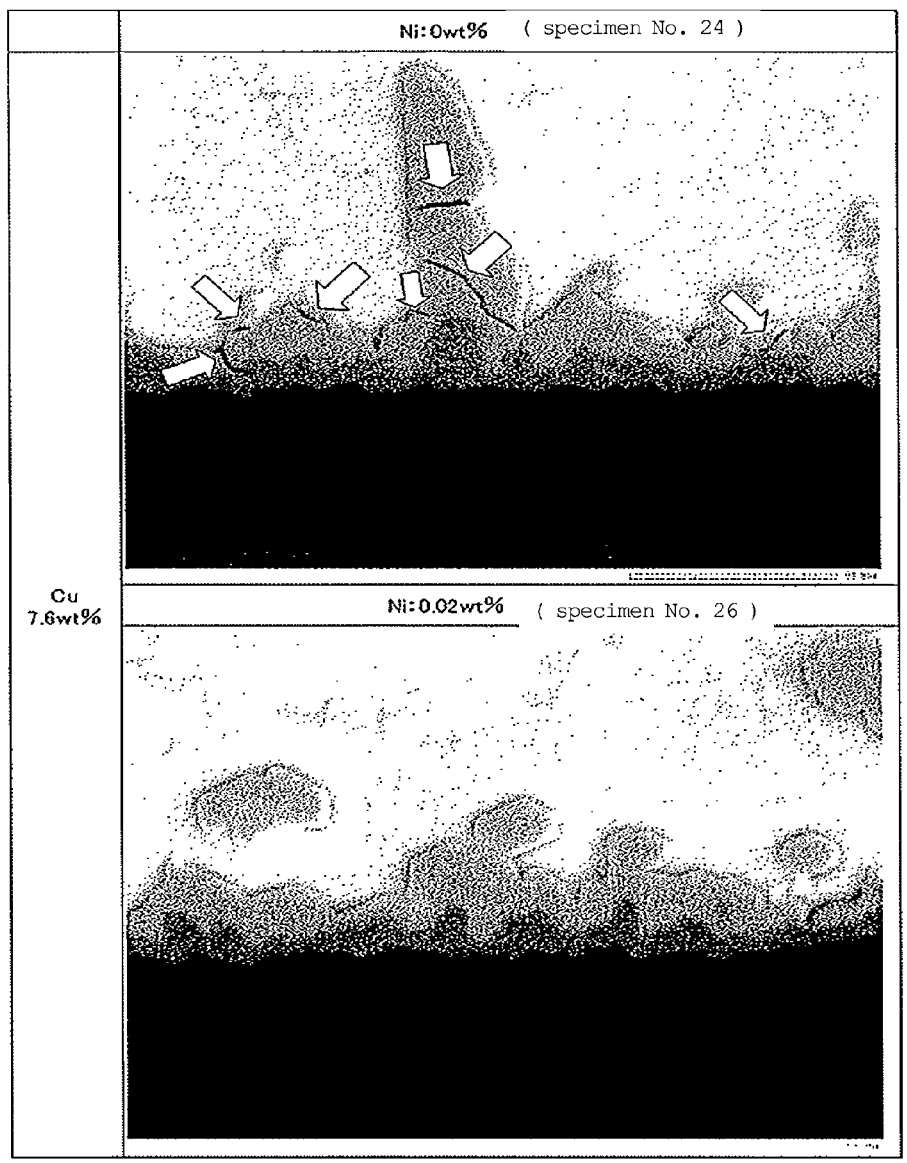
FIG. 20 is a photograph illustrating a cross-section of the intermetallic compound in accordance with the fourth embodiment of the present invention.
Figure 21:
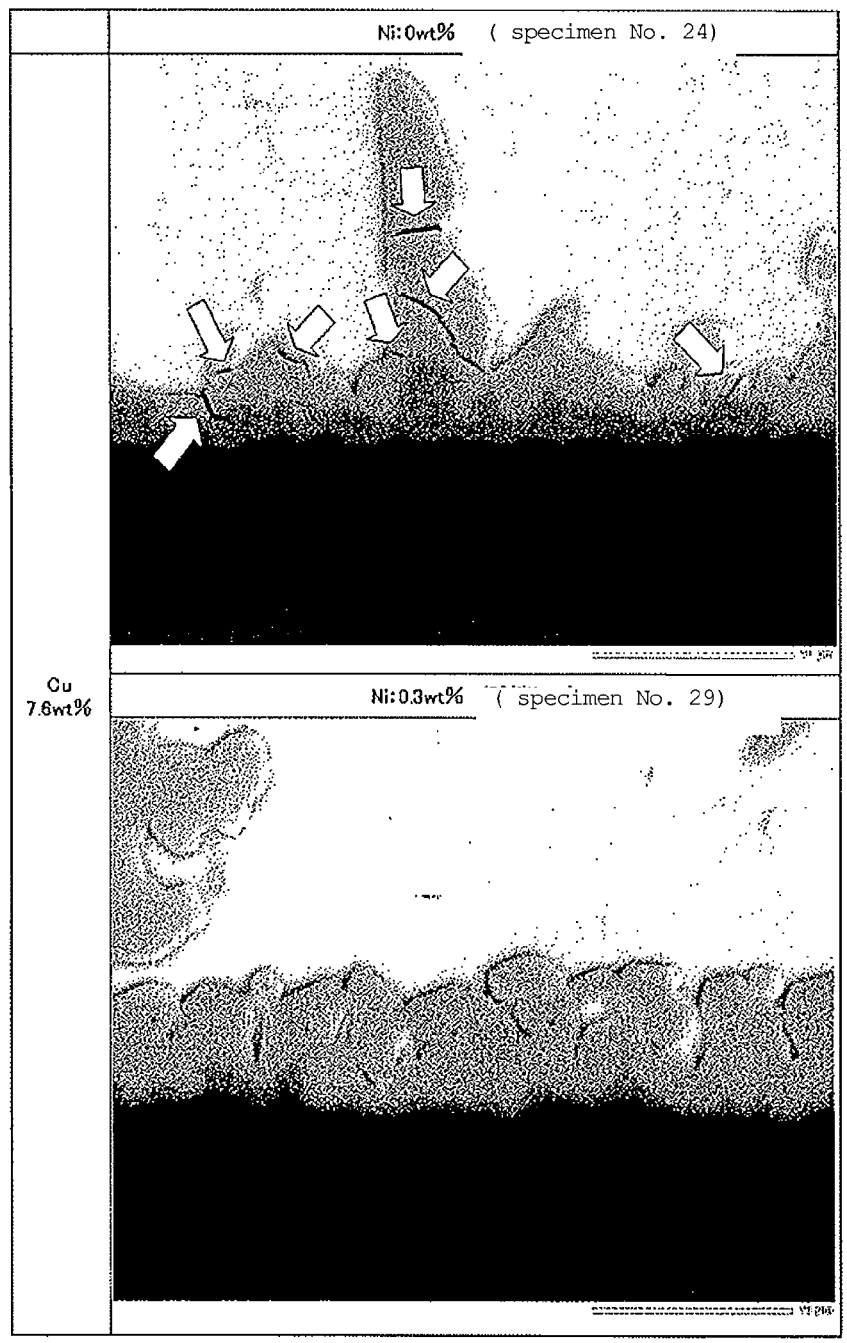
FIG. 21 is a photograph illustrating a cross-section of the intermetallic compound in accordance with the fourth embodiment of the present invention.

Next, junction specimens (joint specimens) are made through the reflow soldering process using the specimens having the same composition as in the embodiment 2, and an impact test is performed on the junction sections. The purpose of this test is to verify the effect of impacts based on the generally accepted knowledge that the junction portion suffering a lot from cracks has a low impact absorption capability. A printed board used is an FR-4 material having a thickness of 1.6 mm and the specimen obtained had a land diameter of 0.42 mm. The test instrument used in the impact test is a high-speed bond tester (4000HS manufactured by dage Corporation), and the results are tested at four conditions of pull speeds 1, 10, 100, and 200 (mm/sec). Table 3 lists the measurement values, and FIG. 9 is a comparison graph of the test results. In the graph, the triangular plot illustrates a Sn—Cu specimen, and the square plot illustrates the Sn—Cu specimen with Ni added.

TABLE 3

[Measurement values of an amount of absorbed energy in pull test of a solder bonded specimen performed using BGA ball solder]
1. Measurement values of an amount of absorbed energy in pull test of BGA solder

| | Pull speed (mm/sec) | | | |
|---|---|---|---|---|
| Specimen No. | 1 | 10 | 100 | 200 |
| SC | 1.19 | 1.92 | 0.89 | 1.17 |
| SCN | 1.06 | 1.70 | 2.11 | 1.96 |

(Unit: mJ)

As clear from the above impact test, the specimen with Ni added makes almost no difference from the Sn—Cu specimen up to a pull speed of 10 mm/sec. However, the specimen with Ni added provides a higher resistance when a high amount of energy above that pull speed is applied.

EMBODIMENT 4

Furthermore, in order to verify that the intended advantage of the present invention is achieved not only in the reflow soldering process but also in the flow soldering process, the inventor makes a specimen through dipping, and conducts the same verification test as the one discussed in connection with the embodiment 2. Table 4 lists the results.

TABLE 4

[Compositions of alloys used in test and measurement values of the number of cracks and crack overall length per IMC layer unit length of specimens soldered through dipping]

| | [Alloy composition] Content (wt %) | | | [Number of cracks and crack overall length per IMC layer unit length] | | | |
|---|---|---|---|---|---|---|---|
| Specimen No. | Sn | Cu | Ni | Number of cracks (unit: crack) | Crack length (unit: μm) | Number of cracks per IMC layer unit length | Overall crack length per IMC layer unit length |
| 1 | 99.99 | 0.01 | 0 | 17.5 | 18.64 | 0.03 | 0.04 |
| 2 | 99.98 | 0.01 | 0.01 | 8.5 | 13.78 | 0.02 | 0.03 |

TABLE 4-continued

[Compositions of alloys used in test and measurement values of the number of cracks and crack overall length per IMC layer unit length of specimens soldered through dipping]

| Specimen No. | [Alloy composition] Content (wt %) | | | Number of cracks (unit: crack) | Crack length (unit: μm) | Number of cracks per IMC layer unit length | Overall crack length per IMC layer unit length |
|---|---|---|---|---|---|---|---|
| | Sn | Cu | Ni | | | | |
| 3 | 99.96 | 0.01 | 0.03 | 1 | 1.21 | 0 | 0 |
| 4 | 99.89 | 0.01 | 0.1 | 4 | 5.1 | 0.01 | 0.01 |
| 5 | 99.69 | 0.01 | 0.3 | 1.5 | 4.09 | 0 | 0.01 |
| 6 | 93.99 | 0.01 | 6 | 2 | 4.24 | 0 | 0.01 |
| 7 | 99.9 | 0.1 | 0 | 28 | 33.49 | 0.05 | 0.06 |
| 8 | 99.89 | 0.1 | 0.01 | 12 | 23.88 | 0.02 | 0.05 |
| 9 | 99.87 | 0.1 | 0.03 | 3 | 5.68 | 0.01 | 0.01 |
| 10 | 99.8 | 0.2 | 0 | 5.5 | 10.12 | 0.01 | 0.02 |
| 11 | 99.799 | 0.2 | 0.001 | 1.5 | 1.65 | 0 | 0 |
| 12 | 99.79 | 0.2 | 0.01 | 2 | 2.92 | 0 | 0.01 |
| 13 | 99.77 | 0.2 | 0.03 | 1 | 2.96 | 0 | 0.01 |
| 14 | 99.7 | 0.2 | 0.1 | 0.5 | 1.39 | 0 | 0 |
| 15 | 99.08 | 0.92 | 0 | 26 | 36.89 | 0.05 | 0.07 |
| 16 | 99.079 | 0.92 | 0.001 | 17 | 32.37 | 0.03 | 0.06 |
| 17 | 99.07 | 0.92 | 0.01 | 1 | 1.29 | 0 | 0 |
| 18 | 99.05 | 0.92 | 0.03 | 4 | 8.48 | 0.01 | 0.02 |
| 19 | 98.98 | 0.92 | 0.1 | 6.5 | 9.78 | 0.01 | 0.02 |
| 20 | 97 | 3 | 0 | 130 | 202.21 | 0.58 | 0.91 |
| 21 | 96.95 | 3 | 0.05 | 60 | 59.56 | 0.29 | 0.29 |
| 22 | 96.9 | 3 | 0.1 | 75 | 98.92 | 0.35 | 0.46 |
| 23 | 96.7 | 3 | 0.3 | 87 | 111.98 | 0.42 | 0.54 |
| 24 | 93 | 7 | 0 | 87 | 136.26 | 0.42 | 0.67 |
| 25 | 92.95 | 7 | 0.05 | 23 | 55.87 | 0.12 | 0.28 |
| 26 | 92.9 | 7 | 0.1 | 49 | 79.86 | 0.22 | 0.37 |
| 27 | 92.7 | 7 | 0.3 | 58 | 98.77 | 0.27 | 0.46 |
| 28 | 92.4 | 7.6 | 0 | 25.5 | 48.78 | 0.05 | 0.09 |
| 29 | 92.39 | 7.6 | 0.01 | 13.5 | 19.61 | 0.03 | 0.04 |
| 30 | 92.38 | 7.6 | 0.02 | 0 | 0 | 0 | 0 |
| 31 | 92.37 | 7.6 | 0.03 | 0.5 | 2.29 | 0 | 0 |
| 32 | 92.3 | 7.6 | 0.1 | 0 | 0 | 0 | 0 |
| 33 | 92.1 | 7.6 | 0.3 | 0 | 0 | 0 | 0 |
| 34 | 86.4 | 7.6 | 6 | 0.5 | 12 | 0 | 0 |

In the specimens listed in Table 4, Cu is prepared to have seven concentrations with respect to Sn, namely, 0.01% by weight, 0.1% by weight, 0.2% by weight, 0.92% by weight, 3% by weight, 7% by weight, and 7.6% by weight. Furthermore, Ni is added with reference to prepared Cu to have eight additive levels for appropriate selection, namely, no Ni addition, 0.001% by weight, 0.01% by weight, 0.03% by weight, 0.05% by weight, 0.1% by weight, 0.3% by weight, and 6% by weight. In this way, 34 types of specimens are prepared. It is noted that the dipping technique is an ordinary method. The 34 types of specimens thus prepared are embedded into an epoxy resin to make cross-section observation specimens. Using the same test instrument as the one used in the embodiment 2, the actual number of cracks and the crack length are measured.

Table 5 lists the number of cracks and the crack overall length on a percentage scale with the occurrences of cracks in the specimen with no Ni added being 100, wherein the actual measurement values listed in Table 4 are divided into seven types of group according to the additive amount of Cu. This comparison is identical to that in Table 2.

TABLE 5

[Compositions of alloys used in test and measurement values of the number of cracks and crack overall length per IMC layer unit length of specimens soldered through dipping]

| Specimen No. | [Alloy composition] Content (wt %) | | | Number of cracks per IMC layer unit length (unit: %) | Overall crack length per IMC layer unit length (unit: %) |
|---|---|---|---|---|---|
| | Sn | Cu | Ni | | |
| 1 | 99.99 | 0.01 | 0 | 100.0 | 100.0 |
| 2 | 99.98 | 0.01 | 0.01 | 66.7 | 75.0 |
| 3 | 99.96 | 0.01 | 0.03 | 0.0 | 0.0 |
| 4 | 99.89 | 0.01 | 0.1 | 33.3 | 25.0 |
| 5 | 99.69 | 0.01 | 0.3 | 0.0 | 25.0 |
| 6 | 93.99 | 0.01 | 6 | 0.0 | 25.0 |
| 7 | 99.9 | 0.1 | 0 | 100.0 | 100.0 |
| 8 | 99.89 | 0.1 | 0.01 | 40.0 | 83.3 |
| 9 | 99.87 | 0.1 | 0.03 | 20.0 | 16.7 |
| 10 | 99.8 | 0.2 | 0 | 100.0 | 100.0 |
| 11 | 99.799 | 0.2 | 0.001 | 0.0 | 0.0 |
| 12 | 99.79 | 0.2 | 0.01 | 0.0 | 50.0 |
| 13 | 99.77 | 0.2 | 0.03 | 0.0 | 50.0 |
| 14 | 99.7 | 0.2 | 0.1 | 0.0 | 0.0 |
| 15 | 99.08 | 0.92 | 0 | 100.0 | 100.0 |

TABLE 5-continued

[Compositions of alloys used in test and measurement values of the number of cracks and crack overall length per IMC layer unit length of specimens soldered through dipping]

| Specimen No. | [Alloy composition] Content (wt %) | | | [Number of cracks and crack overall length per IMC layer unit length] | |
|---|---|---|---|---|---|
| | Sn | Cu | Ni | Number of cracks per IMC layer unit length (unit: %) | Overall crack length per IMC layer unit length (unit: %) |
| 16 | 99.079 | 0.92 | 0.001 | 60.0 | 85.7 |
| 17 | 99.07 | 0.92 | 0.01 | 0.0 | 0.0 |
| 18 | 99.05 | 0.92 | 0.03 | 0.0 | 0.0 |
| 19 | 98.98 | 0.92 | 0.1 | 20.0 | 28.6 |
| 20 | 97 | 3 | 0 | 100.0 | 100.0 |
| 21 | 96.95 | 3 | 0.05 | 50.0 | 31.9 |
| 22 | 96.9 | 3 | 0.1 | 60.3 | 50.5 |
| 23 | 96.7 | 3 | 0.3 | 72.4 | 59.3 |
| 24 | 93 | 7 | 0 | 100.0 | 100.0 |
| 25 | 92.95 | 7 | 0.05 | 28.6 | 41.8 |
| 26 | 92.9 | 7 | 0.1 | 52.4 | 55.2 |
| 27 | 92.7 | 7 | 0.3 | 64.3 | 68.7 |
| 28 | 92.4 | 7.6 | 0 | 100.0 | 100.0 |
| 29 | 92.39 | 7.6 | 0.01 | 60.0 | 44.4 |
| 30 | 92.38 | 7.6 | 0.02 | 0.0 | 0.0 |
| 31 | 92.37 | 7.6 | 0.03 | 0.0 | 0.0 |
| 32 | 92.3 | 7.6 | 0.1 | 0.0 | 0.0 |
| 33 | 92.1 | 7.6 | 0.3 | 0.0 | 0.0 |
| 34 | 86.4 | 7.6 | 6 | 0.0 | 0.0 |

FIGS. 10-15 are graphs in which the measurement results of the specimens excluding 7% by weight Cu of the results of FIG. 5 are plotted in a visually easy-to-understand manner. There is no particular technical meaning to the exclusion of a graph of 7% by weight Cu. As clear from these graphs, the comparison of the Sn—Cu specimens shows that the actual number of cracks and the overall crack length are substantially reduced in all the specimens with Ni added. In particular, the specimens having the Cu additive amounts of 0.2% by weight and 0.92% by weight and the Ni additive amount of 0.001% by weight are tested (FIG. 12 and FIG. 13), and the number of cracks and the overall length are substantially small in comparison with the specimens with no Ni added. The addition of Ni of 0.001% by weight proves sufficiently effective. On the other hand, cracks appears on the right portions in FIGS. 10 and 15 in the specimens (specimen Nos. 6 and 30) having the Ni additive amount of 6% by weight, but are not illustrated from the graphical point of view. However, as clear from Table 4 and Table 5, no cracks are noticed in the specimen No. 30, and only infinitesimal cracks are noticed in the specimen No. 6. It is thus determined that substantially the same results as in other specimens are obtained in a range from the Ni additive amount of 0.3% by weight to the Ni additive amount of 6% by weight. FIGS. 16-21 are cross-sectional SEM photographs of specimens of 11 types out of the specimens obtained in the embodiment 4, and the specimens with Ni added and the specimens with no Ni added are visually compared with respect to five types of Cu additive amounts. As clear from these photographs, almost no growth of needle crystals such as $Cu_6Sn_5$ is noticed in the specimens with Ni added, and no cracks are found. Furthermore, the specimen numbers in each drawing correspond to the specimen numbers listed in Table 4.

EMBODIMENT 5

Next, tests are conducted to verify the advantages of the compositions with Pd, Co, Mn, Zn, and Pt substituted for Ni. The production and measurement of specimens comply with those of the embodiment 4. Table 6 lists the composition of each specimen, the number of cracks, and the overall length, and Table 7 lists the composition of each specimen, the number of cracks, and the overall length on a percentage scale with the number of cracks and the overall length of the Sn—Cu two-element composition being 100.

TABLE 6

[Alloy compositions with other elements substituted for Ni and measurement values of the number of cracks and the crack overall length per IMC layer unit length of specimens solder bonded through dipping]
[Measurement values of elements substituted for Ni]

| Evaluation item | Substitute element and alloy composition | | | | | |
|---|---|---|---|---|---|---|
| | (No additive) Sn0.92Cu | Mn Sn0.92Cu0.1Mn | Zn Sn0.92Cu0.1Zn | Pd Sn0.92Cu0.1Pd | Pt Sn0.92Cu0.1Pt | Co Sn0.92Cu0.1Co |
| Number of cracks (unit: crack) | 10.5 | 2 | 1 | 5 | 0 | 0 |
| Overall crack length (unit: μm) | 22.4 | 2.49 | 0.57 | 9.93 | 0 | 0 |
| Overall crack length per IMC layer unit length | 0.04 | 0.00 | 0.00 | 0.02 | 0.00 | 0.00 |
| Number of cracks per IMC layer unit length | 0.02 | 0.00 | 0.00 | 0.01 | 0.00 | 0.00 |

TABLE 7

[Alloy compositions with other elements substituted for Ni and measurement values of the number of cracks and the crack overall length per IMC layer unit length of specimens solder bonded through dipping]
[Measurement values of elements substituted for Ni with measurement value of Sn0.92Cu being 100]

| | Substitute element and alloy composition | | | | | |
|---|---|---|---|---|---|---|
| Evaluation item | (No additive) Sn0.92Cu | Mn Sn0.92Cu0.1Mn | Zn Sn0.92Cu0.1Zn | Pd Sn0.92Cu0.1Pd | Pt Sn0.92Cu0.1Pt | Co Sn0.92Cu0.1Co |
| Number of cracks | 100 | 19.0 | 9.5 | 47.6 | 0.0 | 0.0 |
| Overall crack length | 100 | 11.1 | 2.5 | 44.3 | 0.0 | 0.0 |
| Overall crack length per IMC layer unit length | 100 | 0.0 | 0.0 | 50.0 | 0.0 | 0.0 |
| Number of cracks per IMC layer unit length | 100 | 0.0 | 0.0 | 50.0 | 0.00 | 0.0 |

In this embodiment, the Cu additive amount is one type of 0.92% by weight and the additive amount of each of Pd, Co, Mn, Zn, and Pt is also one type of 0.1% by weight. Although the number of cracks is slightly higher in the Pd added specimens than other metal added specimens, the number of cracks of these specimens is halved in comparison with the Sn—Cu specimens with no such metals added. Also, in comparison with the embodiment 4 in which the Ni addition is verified, the same advantage as that of Ni is theoretically expected even if the Cu additive amount and the additive amount of each of Pd, Co, Mn, Zn, and Pt is changed.

The invention claimed is:

1. A solder joint soldered with an alloy consisting of:
0.01% by weight Cu, 0.001-6% by weight Ni, and the remaining of Sn;
wherein the solder joint comprises an intermetallic compound having the general formula of $(Cu,Ni)_6Sn_5$ with a substitution ratio between Cu and Ni of about 5 Cu: 1 Ni;
wherein the intermetallic compound comprises about 9 atom % Ni; and
wherein the intermetallic compound, when solidified, has a hexagonal crystalline structure.

2. The solder joint soldered with the alloy according to claim 1, wherein the lower limit of Ni is 0.01% by weight.

3. The solder joint soldered with the alloy according to claim 1, wherein the lower limit of Ni is 0.03% by weight.

4. The solder joint soldered with the alloy according to claim 2, wherein the upper limit of Ni is 0.3% by weight.

5. The solder joint soldered with the alloy according to claim 3, wherein the upper limit of Ni is 0.1% by weight.

6. A solder joint soldered with an alloy consisting of:
7.6% by weight Cu, 0.001-6% by weight Ni, and the remaining of Sn;
wherein the solder joint comprises an intermetallic compound having the general formula of $(Cu,Ni)_6Sn_5$ with a substitution ratio between Cu and Ni of about 5 Cu: 1 Ni;
wherein the intermetallic compound comprises about 9 atom % Ni; and
wherein the intermetallic compound, when solidified, has a hexagonal crystalline structure.

7. The solder joint according to claim 6, wherein the lower limit of Ni is 0.01% by weight.

8. The solder joint according to claim 6, wherein the lower limit of Ni is 0.03% by weight.

9. The solder joint according to claim 7, wherein the upper limit of Ni is 0.3% by weight.

10. The solder joint according to claim 8, wherein the upper limit of Ni is 0.1% by weight.

11. The solder joint according to claim 1, wherein the amount of Ni is 0.03% by weight.

12. The solder joint according to claim 1, wherein the amount of Ni is 0.1% by weight.

13. The solder joint according to claim 1, wherein the amount of Ni is 0.3% by weight.

14. The solder joint according to claim 1, wherein the amount of Ni is 6% by weight.

15. The solder joint according to claim 6, wherein the amount of Ni is 0.02% by weight.

16. The solder joint according to claim 6, wherein the amount of Ni is 0.03% by weight.

17. The solder joint according to claim 6, wherein the amount of Ni is 0.1% by weight.

18. The solder joint according to claim 6, wherein the amount of Ni is 0.3% by weight.

19. The solder joint according to claim 6, wherein the amount of Ni is 6% by weight.

* * * * *